United States Patent
Yeh et al.

(10) Patent No.: US 8,343,785 B2
(45) Date of Patent: Jan. 1, 2013

(54) NITRIDOSILICATE PHOSPHOR TUNABLE LIGHT-EMITTING DIODES BY USING UV AND BLUE CHIPS

(75) Inventors: Chiao-Wen Yeh, Taitung (TW); Ru-Shi Liu, Shulin (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 123 days.

(21) Appl. No.: 12/956,244

(22) Filed: Nov. 30, 2010

(65) Prior Publication Data

US 2012/0132936 A1 May 31, 2012

(51) Int. Cl.
*H01L 21/00* (2006.01)
*H01L 33/00* (2010.01)

(52) U.S. Cl. ............................................. 438/29; 257/98

(58) Field of Classification Search .............. 438/22–31, 438/65, 116; 252/301.4 F; 257/88, 98, E33.056–E33.059
See application file for complete search history.

(56) References Cited

U.S. PATENT DOCUMENTS

| | | | |
|---|---|---|---|
| 5,998,925 A * | 12/1999 | Shimizu et al. ............... | 313/503 |
| 6,649,946 B2 | 11/2003 | Bogner et al. | |
| 7,391,060 B2 * | 6/2008 | Oshio ..................... | 252/301.4 F |
| 7,537,710 B2 * | 5/2009 | Oshio ..................... | 252/301.4 F |
| 7,611,641 B2 * | 11/2009 | Schmidt et al. ......... | 252/301.4 F |
| 2006/0220047 A1 | 10/2006 | Nagatomi et al. | |

FOREIGN PATENT DOCUMENTS

WO WO-2006/061778 A1 6/2006

OTHER PUBLICATIONS

Rong-Jun Xie et al., "Photoluminescence of $(Ba_{1-x}Eu_x)Si_6N_8O$ ($0.005 \leq x \leq 0.2$) phosphors", Journal of Luminescence 130 (2010), 2009 Elsevier B.V., pp. 266-269.

Florian Stadler et al., "Synthesis, Crystal Structure and Solid-State NMR Spectroscopic Investigation of the Oxonitridosilicate $BaSi_6N_8O$", 2005, Wiley-VCH, pp. 1773-1778.

C.J. Duan et al., "Preparation, Electronic Structure, and Photoluminescence Properties of $Eu^{2+}$- and $Ce^{3+}/Li^+$-Activated Alkaline Earth Silicon Nitride $MSiN_2$ (M = Sr, Ba)", Chem. Mater. © XXXX American Chemical Society, Published on Web Jan. 3, 2008, pp. A-I.

R. Le Toquin et al., "Red-Emitting Cerium-Based Phosphor Materials for Solid-State Lighting Applications", Science Direct, 2006 Elsevier B.V., Chemical Physics Letters 423 (2006) pp. 352-356.

(Continued)

*Primary Examiner* — Calvin Lee
(74) *Attorney, Agent, or Firm* — Haynes and Boone, LLP

(57) ABSTRACT

The present disclosure provides a radiation device. The radiation device includes a first light emitting diode (LED) operable to emit light having a first central wavelength; a second LED configured adjacent the first LED and operable to emit light having a second central wavelength substantially less than the first central wavelength; and a luminescent material disposed on the first LED and the second LED. The luminescent material includes a strontium silicon nitride ($SrSi_6N_8$) doped by one of cerium ($Ce^{3+}$) and cerium, lithium ($Ce^{3+}$, $Li^+$).

19 Claims, 5 Drawing Sheets

OTHER PUBLICATIONS

Florian Stadler et al., "$SrSi_6N_8$—A Reduced Nitridosilicate with a Si-Si Bond", 2005 Wiley-VCH, Angew. Chem. Int. Ed. 2005, 44, pp. 657-570.

Florian Stadler et al., "The Reduced Nitridosilicate $BaSi_6N_8$", 2007, Wiley-VCH, InterScience, pp. 589-592.

Y.Q. Li et al., "The Effect of Replacement of Sr by Ca on The Structural and Luminescence Properties of the Red-Emitting $Sr_2Si_5N_8:Eu^{2+}$ LED Conversion Phosphor", Journal of Solid State Chemistry 181 (2008), Elsevier, Science Direct, pp. 515-524.

Kousuke Shioi et al., "Luminescence Properties of $SrSi_6N_8:Eu^{2+}$" Springer Science+Business Media, LLC 2008, J Mater Sci (2008) 43:5659-5661.

Unpublished U.S. Appl. No. 12/938,221 entitled "A Phosphor With $Ce^{3+}/Ce^{3+}$, $Li^+$ Doped Luminescent Materials" filed Nov. 2, 2010.

* cited by examiner

NITRIDOSILICATE PHOSPHOR TUNABLE LIGHT-EMITTING DIODES BY USING UV AND BLUE CHIPS

CROSS-REFERENCE TO RELATED APPLICATIONS

The present disclosure is related to the following commonly-assigned U.S. patent application, the entire disclosure of which is incorporated herein by reference: U.S. patent application Ser. No. 12/938,221 filed Nov. 2, 2010 by inventors Chiao-Wen Yeh et al for "A Phosphor with Ce3+/Ce3+, Li+ Doped Luminescent Materials".

BACKGROUND

Light-emitting diode (LED) lighting typically uses nitridosilicates and oxonitridosilicates materials to enhance color rendering index (CRI) and chemical stability. In particular, nitridosilicates have high condensed frameworks, and thus, have stable chemical structures and exhibit thermal stability. Following crystal field splitting theory and nephelauxetic effects, nitride phosphors can emit more red light than oxide phosphors. For example, a blue-emitting diode can be used to excite a nitride phosphor to provide red light. U.S. Pat. No. 6,649,946 discloses nitride phosphors that expose yellow to red emitting phosphor, such as $(Ca, Sr, Ba)_x Si_y N_z$:Eu ($z=2/3x+4/3y$) (for example, $(Ca, Sr, Ba)_{2-x}Si_5N_8$:$Eu_x$). These types of phosphors are synthesized at normal pressure. It has been observed that since nitride phosphors corresponding excitation spectrum does not match the emission spectrum of a blue light-emitting LED, such as an indium gallium nitride (InGaN) LED, existing nitride phosphors less efficient as red light-emitting phosphors than desirable. Accordingly, the corresponding LED devices have less flexibility and capability to tune the colors and the CRI.

Therefore, a LED device integrated with a phosphor material having a proper excitation spectrum and a method of making the same are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
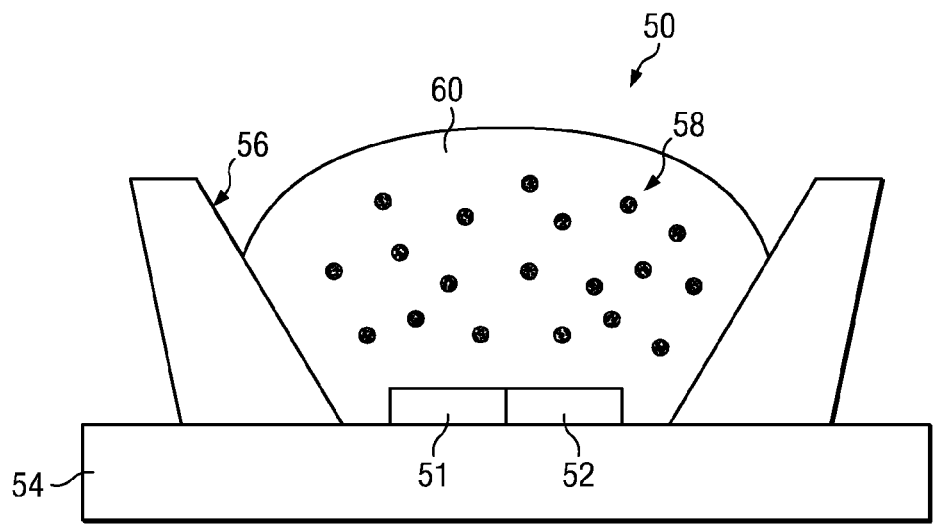
FIG. 1 is a diagrammatic view of an embodiment of a radiation device.

It is understood that the following disclosure provides many different embodiments, or examples, for implementing different features of various embodiments. Specific examples of components and arrangements are described below to simplify the present disclosure. These are, of course, merely examples and are not intended to be limiting. The present disclosure may repeat reference numerals and/or letters in the various examples. This repetition is for the purpose of simplicity and clarity and does not in itself dictate a relationship between the various embodiments and/or configurations discussed.

FIG. 1 is a diagrammatic view of an embodiment of a radiation device constructed according to various aspects of the present disclosure. With reference to FIG. 1 and other figures, the radiation device 50 and the method of making the same are collectively described.

The radiation device 50 includes a first light-emitting diode (LED) 51 and a second LED 52 configured together. Each of the first and second LEDs (51 and 52) is designed to emit light with a particular emission spectrum. Particularly, the first LED 51 emits light having a first central wavelength. The second LED 52 emits light having a second central wavelength less than the first central wavelength. In the present embodiment, the first LED 51 emits blue light, and thus may also be referred to as a blue LED. The second LED 52 emits ultra-violet (UV) light, and thus may also be referred to as an UV-LED.

Figure 2:
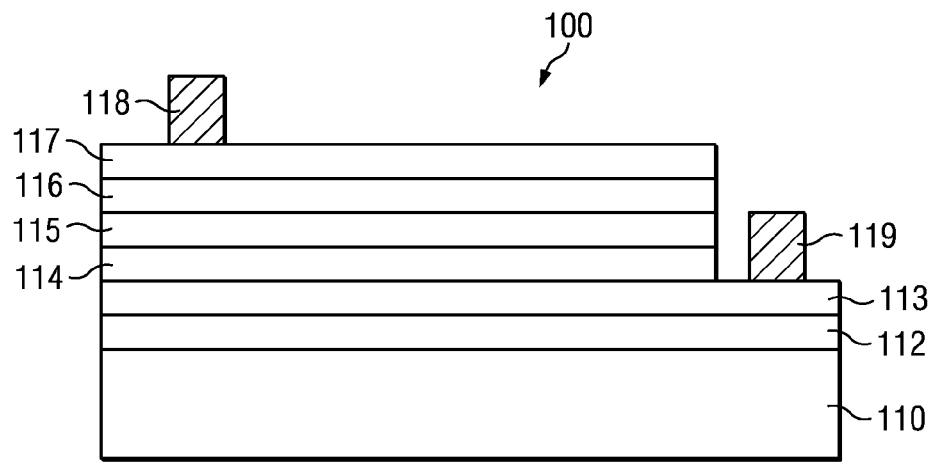
FIG. 2 is a diagrammatic view of a first light-emitting diode (LED) used in the radiation device of FIG. 1.

The first LED 51 is further described in detail. In one embodiment, the first LED 51 emits light having a wavelength range from about 400 nm to about 500 nm. In another embodiment, the first LED 51 includes gallium nitride and indium gallium nitride (GaN—InGaN). FIG. 2 illustrates a side sectional view of a LED 100 as one embodiment of the LED 51. The LED 100 includes p-type doped and n-typed doped semiconductor layers configured to emit spontaneous radiation in visual blue regions of the electromagnetic spectrum. In the present embodiment, the LED 100 emits blue light having an emission peak ranging from about 430 nm to about 490 nm, such as about 460 nm. The LED 100 is formed on a substrate 110, such as a sapphire, silicon carbide, gallium nitride (GaN), or silicon substrate. In the depicted embodiment, the substrate 110 is a sapphire substrate. The LED 100 includes an n-type impurity doped cladding layer 113 and a p-type doped cladding layer 115 formed on the n-type doped cladding layer 113. In one embodiment, the n-type cladding layer 113 includes n-type gallium nitride (n-GaN) doped by silicon or oxygen, and the p-type cladding layer 115 includes p-type gallium nitride (p-GaN) doped by magnesium.

The LED 100 further includes an indium gallium nitride/gallium nitride (InGaN/GaN) multi-quantum well 114 formed between the n-type doped cladding layer 113 and p-type doped cladding layer 115. The LED 100 may further include a buffer layer 112, such as a GaN buffer layer, formed between the substrate 110 and the n-type doped cladding layer 113. The LED 100 may further include a short period super-lattice (SPS) layer 116 formed on the p-type doped cladding layer 115 and designed to block defects. In one embodiment, the SPS layer 116 includes InGaN/GaN films with n-type dopant. In another embodiment, a transparent conductive layer 117, such as indium tin oxide (TTO), is formed on the p-type doped cladding layer 115 or on the SPS layer 116, coupled to a p-electrode 118. An n-electrode 119 is formed and is coupled with the n-type doped cladding layer 113.

Figure 3:
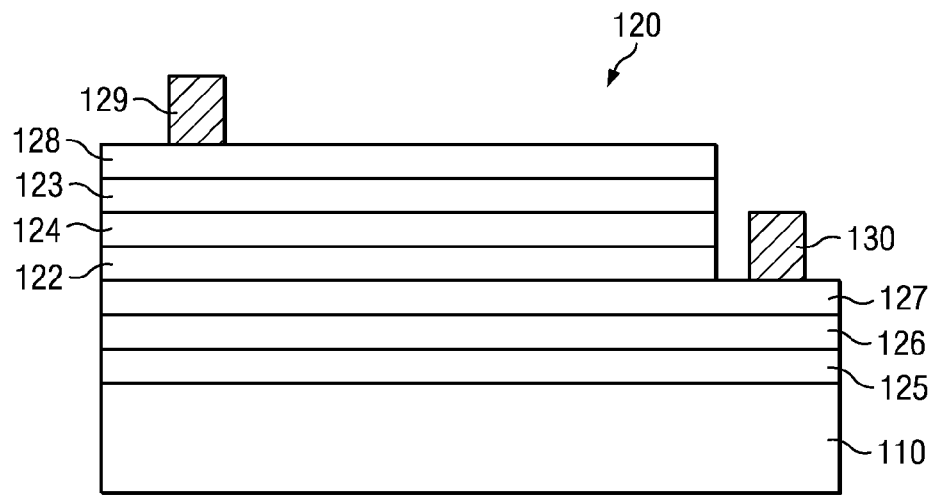
FIG. 3 is a diagrammatic view of a second light-emitting diode (LED) used in the radiation device of FIG. 1.

The second LED 52 is further described in detail. In one embodiment, the second LED 52 emits light having a wavelength range from about 360 nm to about 430 nm. In various embodiments, the second LED 52 includes diamond, boron nitride, aluminum nitride, aluminum gallium nitride, or aluminum gallium indium nitride. In the present embodiment, the second LED 52 includes aluminum gallium nitride (AlGaN). FIG. 3 illustrates a side sectional view of a LED 120 in a side sectional view as one embodiment of the LED 52. The LED 120 includes p-type doped and n-type doped semiconductor layers configured to emit spontaneous radiation ultraviolet regions of the electromagnetic spectrum. The LED 120 is formed on a semiconductor substrate 110, such as a sapphire, silicon carbide, gallium nitride (GaN), or silicon substrate. In the depicted embodiment, the substrate 110 is a sapphire substrate. The LED 120 includes an n-type impurity doped cladding layer 122 and a p-type doped cladding layer 123 formed on the n-type doped cladding layer 122. In one embodiment, the n-type cladding layer 122 includes n-type gallium nitride (n-GaN) with n-type dopant, such as silicon, and the p-type cladding layer 123 includes p-type gallium nitride (p-GaN) with p-type dopant, such as magnesium. In an alternative embodiment, the n-type cladding layer 122 includes n-type aluminum gallium nitride (n-AlGaN) with n-type dopant, such as silicon or oxygen, and the p-type cladding layer 123 includes p-type aluminum gallium nitride (p-AlGaN) with p-type dopant, such as magnesium.

The second LED 120 further includes a multi-quantum well 124 formed between the n-type doped cladding layer 122 and p-type doped cladding layer 123. The multi-quantum well 124 includes gallium nitride/aluminum gallium nitride (GaN—AlGaN) films. In an alternative embodiment, the multi-quantum well 124 includes AlInGaN. In one embodiment, the LED 120 further includes a buffer layer 125, such as a gallium nitride (GaN) buffer layer, formed between the substrate 110 and the n-type doped cladding layer 122. Alternatively, the buffer layer 125 includes aluminum nitride (AlN). The LED 120 may further include a super-lattice layer 126 formed on the buffer layer 125 and underlying the n-type doped cladding layer 122. In another embodiment, the super-lattice layer 126 includes aluminum nitride/aluminum gallium nitride (AlN/AlGaN) films. The second LED 120 may additionally include an n+ doped AlGaN layer 127 positioned adjacent the n-AlGaN layer 122 for n-type contact, having a doping concentration greater than that of the n-AlGaN layer 122. Particularly, the n+ doped AlGaN layer 127 is positioned between the n-AlGaN layer 122 and the super-lattice layer 126. The second LED 120 may additionally include a p+ doped layer 128 positioned adjacent the p-AlGaN layer 123, having a doping concentration greater than that of the p-AlGaN layer 123. Particularly, the p+ doped layer 128 includes aluminum indium gallium nitride (AlInGaN). A transparent conductive layer 129, such as indium tin oxide (ITO), is formed on the p+-AlInGaN layer 128, coupled to a p-electrode 129. An n-electrode 130 is formed and is coupled with the n+-AlGaN layer 127 or the n-AlGaN layer 122.

The LEDs 100 and 120 are provided for only illustration and may vary in various applications. For example, the LEDs 51 and 52 may be extended to other light-emitting devices. Other light emitting devices may be additionally or alternatively formed or used. The LEDs 51 and 52 may include other features, such as a drive circuit.

Referring back to FIG. 1, the LEDs 51 and 52 are configured side by side. The LEDs 51 and 52 may be configured otherwise for proper light emitting effect in varying applications. In one embodiment, the LEDs 51 and 52 may be formed in a same substrate, such as a sapphire, silicon carbide, gallium nitride, or silicon substrate. For example, a gallium nitride layer is formed on a silicon substrate. Then, a patterned indium gallium nitride layer is formed on the gallium nitride layer and is designed for the first LED (blue LED) 51. A patterned aluminum gallium nitride is then formed on the gallium nitride layer and is designed for the second LED (UV-LED) 52.

The radiation device 50 also includes a support substrate 54, such that the LEDs 51 and 52 can be attached on for mechanical support, thermal dissipation, and/or other packaging functions. The LEDs 51 and 52 are attached to the support substrate 54 through an adhesive material, such as silver paste or soldering. In one embodiment, the support substrate 54 includes a silicon wafer or a portion of the silicon wafer. In furtherance of the embodiment, the electrodes of the LEDs can be routed to a power supply through a proper structure, such as a through silicon via (TSV). In another embodiment, the support substrate 54 includes a conductive material, such as copper or aluminum. The LEDs 51 and 52 are attached to the support substrate 54 through an adhesive layer, such as a conductive adhesive layer. In one or more examples, the LEDs 51 and 52 are bonded to the support substrate 54 through silver paste or solder. In various embodiments, the LEDs 51 and 52 are configured with the support substrate 54 such that the corresponding p-electrodes and n-electrodes are properly routed to power lines.

In another embodiment, the radiation device 50 also includes one or more reflective features 56 attached to the support substrate 54 and designed to effectively reflect blue and UV light emitted from the LEDs 51 and 52, respectively, enhancing radiation efficiency. The reflective features 56 include a material having a high reflectivity. For example, the reflective features 56 include silicone formed by molding. In another example, the reflective features 56 include polyphthalamide (PPA) formed by molding.

The radiation device 50 includes a luminescent material (or phosphor) 58 positioned around the LEDs 51 and 52 and designed to shift the light emitted from the LEDs 51 and 52. More particularly, the luminescent material 58 is operable to be excited by the LED 51 and to emit light having a wavelength ranging from about 550 nm to about 800 nm. Additionally, the luminescent material 58 is operable to be excited by the LED 52 and to emit light having a wavelength ranging from about 400 nm to about 600 nm. In one embodiment, the luminescent material 58 emits red light, such as red light having a peak at about 630 nm, when excited by blue light. The luminescent material 58 additionally emits bluish green light to yellow light, such as light having a peak at about 470 nm, when excited by UV light. In one embodiment, the luminescent material 58 has a range of excitation wavelength between about 300 nm-400 nm and about 400 nm-500 nm.

The luminescent material 58 is formed or provided in powder. The luminescent material 58 is a nitridosilicate phosphor $Ce^{3+}$ doped or $Ce^{3+}$, $Li^+$ co-doped. The nitridosilicate phosphors has a composition with a formula of $M_{x-z}Si_y N_{2/3x+11/9y}:RE_z$, where M=Ca, Sr, or Ba; parameters x, y, and z satisfy 0<z<x<y; and RE is rare earth element(s) $Ce^{3+}$, or $Ce^{3+}$ and $Li^+$. In one embodiment, the nitridosilicate phosphor includes cerium doped ($Ce^{3+}$) strontium nitridosilicate, $Sr_{1-x}Si_6N_8:Ce^{3+}{}_x$. In one example, the parameter x ranges between about 0.05 to about 0.5, formulated as 0.5>x≧0.05. In another embodiment, the nitridosilicate phosphor includes cerium and lithium-codoped ($Ce^{3+}$, $Li^+$) strontium nitridosilicate, $Sr_{1-2x}Si_6N_8:Ce^{3+}{}_x$, $Li^+{}_x$. In one example, the parameter x ranges between about 0.05 to about 0.5, formulated as 0.5>x≧0.05.

According to the present embodiment, the luminescent material 58 emits a broad emission band in wavelength ranges of about 400 nm-600 nm and about 550 nm-800 nm. Since the nitridosilicate phosphor can be excited by LED 51, LED 52 or both, the same nitridosilicate phosphor is used as the luminescent material for both LEDs 51 and 52, thereby providing radiation efficiency and cost-effectiveness.

The luminescent material 58 is distributed around the LEDs 51 and 52. In one embodiment, the luminescent material 58 is directly disposed on the LEDs 51 and 52. In another embodiment, the luminescent material 58 is remotely disposed around the LEDs 51 and 52. For example, the luminescent material 58 is separated from the LEDs 51 and 52 by an encapsulation material. In yet another embodiment, the luminescent material 58 is disposed directly on and remotely around the LEDs 51 and 52. In the present embodiment, the luminescent material 58 is dispersed in a transparent material 60, such as silicone or epoxy. The transparent material 60 with the dispersed luminescent material 58 is disposed around the LEDs 51 and 52, as illustrated in FIG. 1.

The radiation device 50 may further include other features, such as other packaging components or driving circuits. In field operation, the LEDs 51 and 52 can be active simultaneously or individually. When LED 51 is active, the luminescent material 58 emits red light. When LED 52 is active, the luminescent material 58 emits bluish green to yellow light. When both LEDs 51 and 52 are active, the luminescent material 58 emits white light. In one embodiment, LEDs 51 and 52 are both active with individually tuned emission powers, such that light emitted from the luminescent material 58 is tuned to provide white light with optimized luminescence effect or light with proper spectrum, such that a color rendering index (CRI) is properly tuned.

Figure 4A:
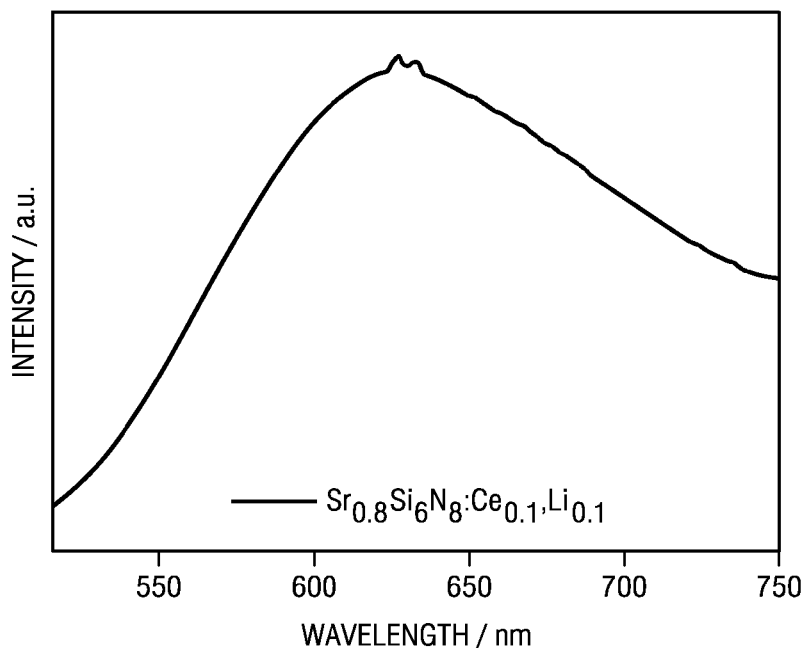
FIGS. 4a, 5a, and 6a are diagrams of emission spectrums of the radiation device of FIG. 1 in various embodiments.
Figure 4B:
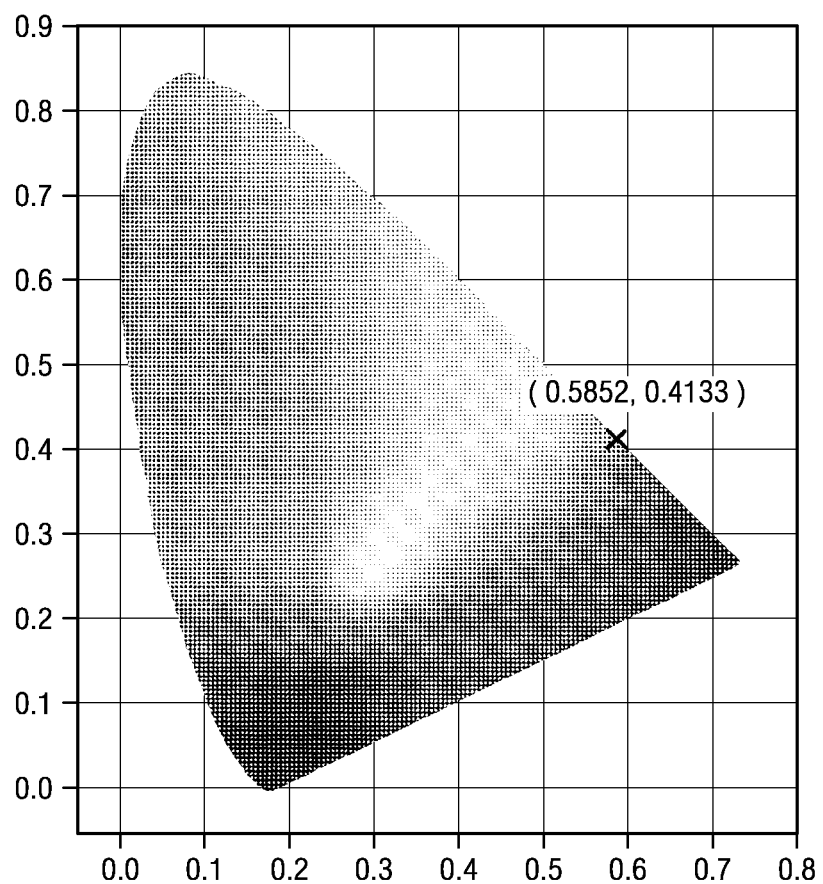
FIGS. 4b, 5b, and 6b are CIE diagrams of CIE XY chromaticity diagrams of the radiation device of FIG. 1 in various embodiments.

In one embodiment, only LED 51 is active, such that the luminescent material 58 emits red light upon being excited by the LED 51. In one particular example, the luminescent material 58 includes cerium and lithium-codoped ($Ce^{3+}$, $Li^+$) strontium nitridosilicate, $Sr_{0.8}Si_6N_8:Ce^{3+}_{0.1}$, $Li^+_{0.1}$. The emission spectrum of the corresponding luminescent material 58 is illustrated in FIG. 4a, which depicts emission intensity in arbitrary units versus wavelength in nanometers (nm). The corresponding CIE XY chromaticity diagram is shown in FIG. 4b. A CIE XY chromaticity diagram quantitatively characterizes light in a color space, created by the International Commission on Illumination (CIE).

Figure 5A:
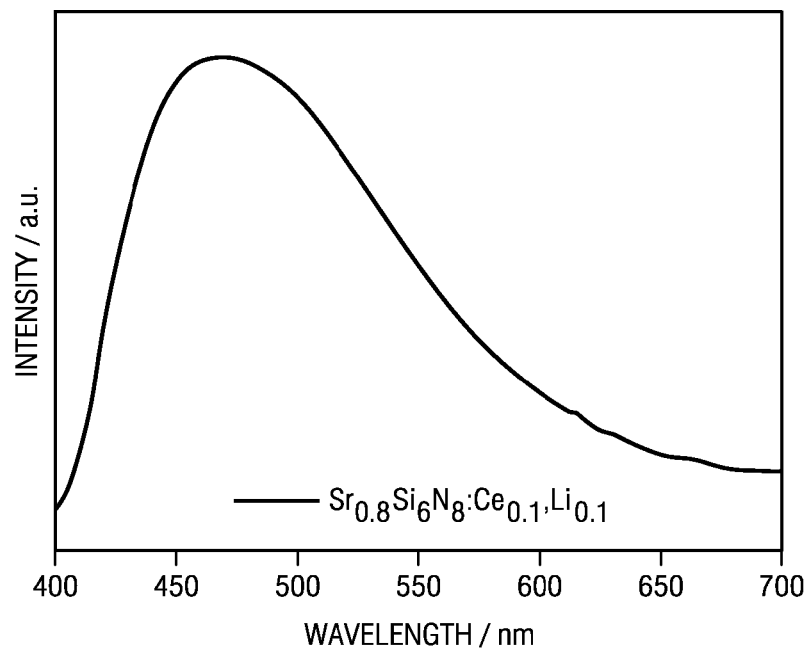
Figure 5B:
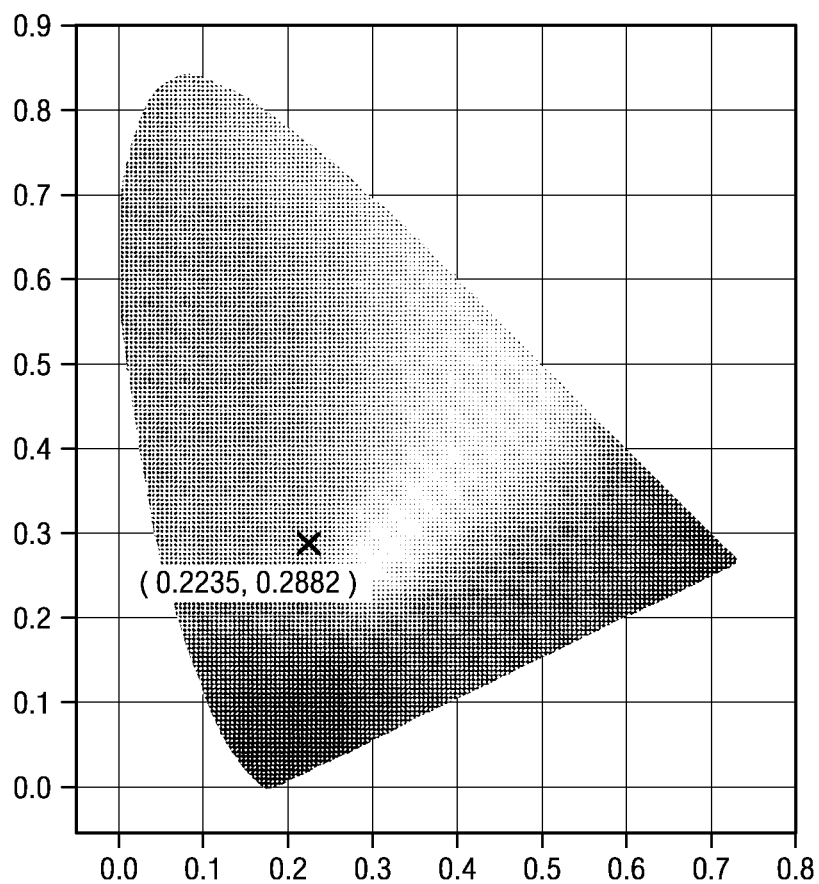

In another embodiment, only LED 52 is active, such that the luminescent material 58 emits bluish green light to yellow light. In one particular example, the luminescent material 58 includes cerium and lithium-codoped ($Ce^{3+}$, $Li^+$) strontium nitridosilicate, $Sr_{0.8}Si_6N_8:Ce^{3+}_{0.1}$, $Li^+_{0.1}$. The emission spectrum of the corresponding luminescent material 58 is illustrated in FIG. 5a, which depicts emission intensity in arbitrary units versus wavelength in nm. The corresponding CIE XY chromaticity diagram is shown in FIG. 5b.

Figure 6A:
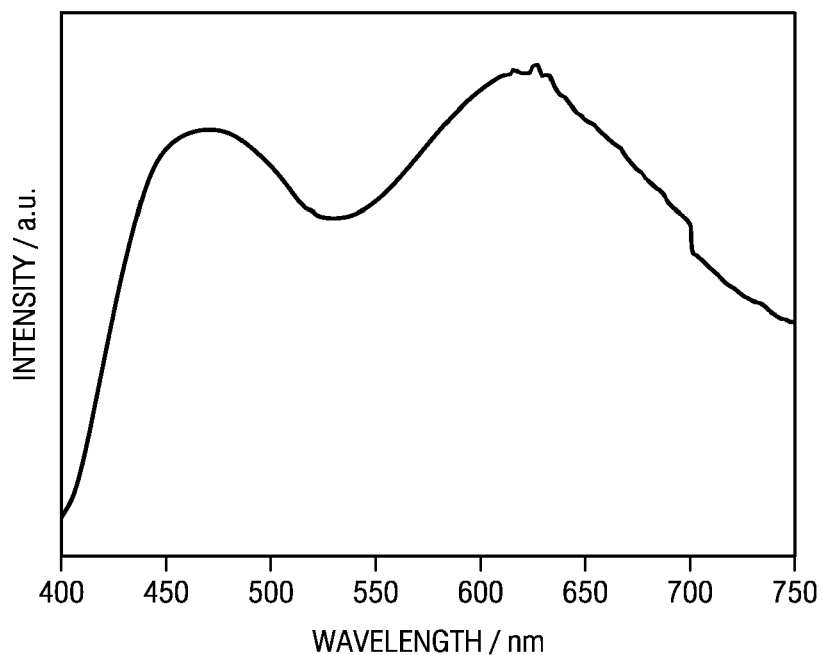
Figure 6B:
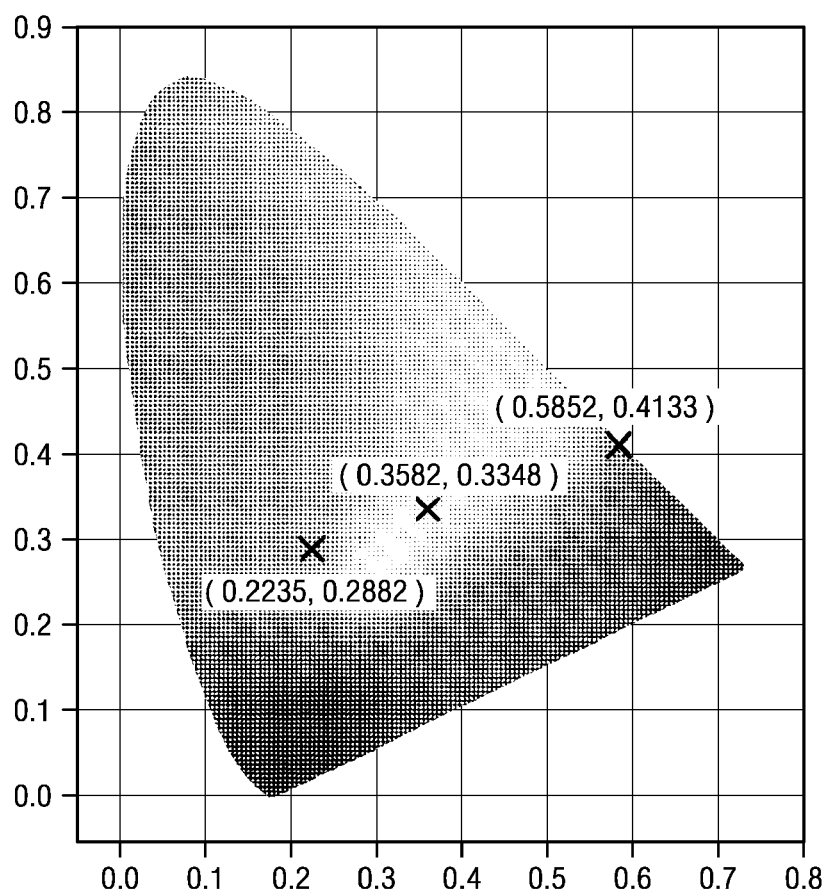

In yet another embodiment, both LEDs 51 and 52 are active, such that the luminescent material 58 emits white light. In one particular example, the luminescent material 58 includes cerium and lithium-codoped ($Ce^{3+}$, $Li^+$) strontium nitridosilicate, $Sr_{0.8}Si_6N_8:Ce^{3+}_{0.1}$, $Li^+_{0.1}$. The emission spectrum of the corresponding luminescent material 58 is illustrated in FIG. 6a, which depicts emission intensity in arbitrary units versus wavelength in nm. The corresponding CIE XY chromaticity diagram is shown in FIG. 6b. In one example, the color temperature Tc=4400 K. The color rendering index (CRI) is 89.11, which is a parameter measuring a light source's ability to reproduce the color of various objects precisely.

Figure 7:
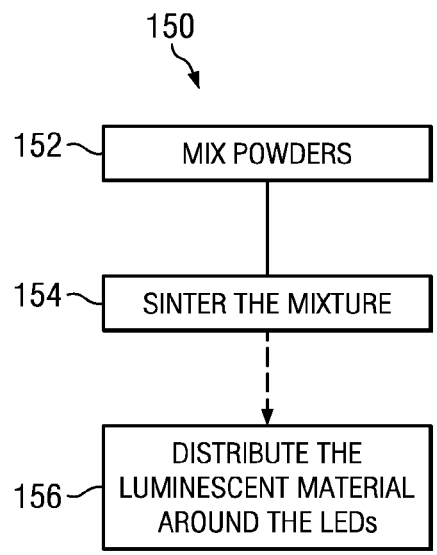
FIG. 7 is a flowchart of a method for making and applying a luminescent material of the radiation device of FIG. 1 according to various embodiments.

FIG. 7 is a flowchart of a method 150 for making and applying the luminescent material (phosphor) 58 according to various aspects of the present disclosure. The luminescent material 58 and the method of making and applying the same are collectively described in detail with reference to FIG. 7.

At step 152, various precursors are mixed stoichiometrically. The precursors are provided in powders. In one embodiment, the precursors are grounded in a mortar under argon atmosphere. The precursors include strontium nitride ($Sr_3N_2$), silicon nitride ($Si_3N_4$), and cerium oxide ($CeO_2$). The powdered strontium nitride, silicon nitride, and cerium oxide are mixed according to certain composition ratios, forming a mixture. For example, powdered strontium nitride, silicon nitride, and cerium oxide are mixed in percentages by weight (or weight percentages) as 25.37, 74.17, and 0.46, respectively.

At step 154, by sintering the mixture to form a nitridosilicate (or silicon nitride) luminescent material (or phosphor) 58 in pink powder. The nitridosilicate luminescent material 58 includes strontium silicon nitride doped by cerium ($Ce^{3+}$) (or cerium activated strontium silicon nitride) having a formula of $SrSi_6N_8:Ce^{3+}$. Particularly, the luminescent material 58 has various compositions defined in a compositional formula as $Sr_{1-x}Si_6N_8:Ce^{3+}_x$, where x is a parameter defining the relative composition contents of strontium and cerium. In one embodiment, the parameter x ranges between about 0.05 and about 0.5. In another embodiment, the parameter x ranges between about 0.01 and about 0.1. In one example, the parameter x is 0.1. In this case, the corresponding compositional formula is $Sr_{0.9}Si_6N_8:Ce^{3+}_{0.1}$.

The sintering of the mixture at step 154 is implemented in a nitrogen atmosphere with a high temperature and a high pressure. In one embodiment, the high temperature ranges between about 1800° C. and about 2000° C. In another embodiment, the high pressure is about 0.90 MPa or higher. In the present embodiment, the high temperature is about 1900° C., and the high pressure is about 0.90 MPa. The sintering at step 154 has a duration greater than about 0.5 hour. In the present embodiment, the sintering duration is about 3 hours.

In one example, the formed nitridosilicate luminescent material $Sr_{1-x}Si_6N_8:Ce^{3+}_x$ has been investigated by x-ray using Bragg diffraction techniques. The Bragg peak in the diffraction pattern indicates that the corresponding $Sr_{1-x}Si_6N_8:Ce^{3+}_x$ luminescent material is in a pure phase.

The present disclosure also provides another embodiment of the nitridosilicate luminescent material 58 and the method of making the same is described below. Still referring to FIG. 7 and the method 150, various precursors are mixed stoichiometrically at step 152. The precursors are provided in powder. In one embodiment, the precursors are grounded in a mortar under argon atmosphere. The precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed according to certain composition ratios. In one example, powdered strontium nitride, silicon nitride, cerium oxide, and lithium nitride are mixed in weight percentages as 25.16, 74.29, 0.46, and 0.09, respectively.

At step 154, sintering the mixture to form a nitridosilicate luminescent material 58 as pink powder. The nitridosilicate luminescent material 58 includes strontium silicon nitride co-doped by cerium ($Ce^{3+}$) and lithium ($Li^+$) and has a formula of $SrSi_6N_8:Ce^{3+}$, $Li^+$. Particularly, the luminescent material 58 has various compositions defined in a compositional formula as $Sr_{1-2x}Si_6N_8:Ce^{3+}_x$, $Li^+_x$, where x is a parameter defining the relative composition contents of strontium, cerium, and lithium. In one embodiment, the parameter x ranges between about 0.05 and about 0.5. In another embodiment, the parameter x ranges between about 0.01 and about 0.1. In the present embodiment associated with FIGS. 4a-6b, the parameter x is 0.1. In this case, the corresponding nitridosilicate luminescent material 58 has a compositional formula of $Sr_{0.8}Si_6N_8:Ce^{3+}_{0.1}, Li^+_{0.1}$.

The sintering of the mixture at step 154 is implemented in a nitrogen atmosphere with a high temperature and a high pressure. In one embodiment, the high temperature ranges between about 1800° C. and about 2000° C. In another embodiment, the high pressure is about 0.90 MPa or higher. In the present embodiment, the high temperature is about 1900° C., and the high pressure is about 0.90 MPa. The sintering at step 154 has a sintering duration greater than about 0.5 hour. In the present embodiment, the sintering duration is about 3 hours. In one example, the formed nitridosilicate luminescent material $Sr_{1-2x}Si_6N_8:Ce^{3+}_x, Li^+_x$ (x is 0.1) has been investigated by x-ray using Bragg diffraction techniques. The Bragg peak in the diffraction pattern indicates that the $Sr_{1-2x}Si_6N_8:Ce^{3+}_x, Li^+_x$ luminescent material is in a pure phase.

Various examples are provided according to one or more embodiments of the present disclosure. In the first example, the precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 20.47, 74.06, 4.55, and 0.92, respectively. In the present example, the sintering temperature is about 1900° C.; the nitrogen pressure is about 0.90 MPa; and the sintering duration is about 3 hours. The formed nitridosilicate luminescent material $Sr_{1-2x}Si_6N_8:Ce^{3+}_x, Li^+_x$ (x is 0.1) has been investigated by x-ray using Bragg diffraction techniques. The Bragg peak in the diffraction pattern indicates that the $Sr_{0.8}Si_6N_8:Ce^{3+}_{0.1}, Li^+_{0.1}$ luminescent material is in a pure phase.

In the second example, the precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 23.08, 74.19, 2.27, and 0.46, respectively. In the present example, the sintering temperature is about 1900° C.; the nitrogen pressure is about 0.90 MPa; and the sintering duration is about 3 hours. The formed nitridosilicate luminescent material is thus represented by a formula of $Sr_{1-2x}Si_6N_8:Ce^{3+}_x, Li^+_x$, where x is about 0.05.

In the third example, the precursors include strontium nitride ($Sr_3N_2$), silicon nitride ($Si_3N_4$), cerium oxide ($CeO_2$), and lithium nitride ($Li_3N$). The powdered strontium nitride, silicon nitride, cerium oxide, and lithium nitride are mixed in weight percentages of 25.16, 74.29, 0.46, and 0.09, respectively. In the present example, the sintering temperature is about 1950° C.; the nitrogen pressure is about 0.90 MPa; and the sintering duration is about 3 hours. The formed nitridosilicate luminescent material is thus represented by a formula of $Sr_{1-2x}Si_6N_8:Ce^{3+}_x, Li^+_x$, where x is about 0.01.

The nitridosilicate luminescent material 58 formed by the method 150, such as the nitridosilicate materials described above, is cerium ($Ce^{3+}$) doped, or cerium and lithium ($Ce^{3+}$, $Li^+$) co-doped. The nitridosilicate luminescent material 58 described above and formed by the method 150 can emit red light under blue excitation, and is therefore referred to as blue-to-red nitridosilicate phosphors doped by $Ce^{3+}$ or $Ce^{3+}$, $Li^+$. In one embodiment, the blue-to-red nitridosilicate phosphors include an excitation spectrum peak ranging from about 430 nm to about 490 nm. The blue-to-red nitridosilicate phosphors use cerium oxide ($CeO_2$) as an activator, or cerium oxide ($CeO_2$) and lithium nitride ($Li_3N$) as an activator. The nitridosilicate luminescent material 58 described above and formed by the method 150 can also emit bluish green light to yellow light under UV excitation.

The present disclosure also provides another embodiment of the nitridosilicate luminescent material 58 doped by $Ce^{3+}$ or $Ce^{3+}$, $Li^+$, which emits red light under blue excitation and emits bluish green light to yellow light under UV light excitation. The nitridosilicate luminescent material 58 is formed by steps 152 and 154 of the method 150 according to one embodiment. Particularly, the nitridosilicate luminescent material 58 is synthesized at high pressure. The $Ce^{3+}$-doped (or $Ce^{3+}$, $Li^+$-doped) nitridosilicate phosphor has a composition formula of $M_{x-z}Si_yN_{2/3x+11/9y}:RE_z$, where M=Ca, Sr, or Ba; parameters x, y, and z satisfy 0<z<x<y; and RE is rare earth element(s) $Ce^{3+}$, or $Ce^{3+}$ and $Li^+$.

Referring to the method 150 in FIG. 7 and further referring to FIG. 1, step 156 is provided as one step to form the radiation device 50 of FIG. 1. At step 156, the luminescent material 58 is distributed around LEDs 51 and 52, such that the luminescent material 58 can be efficiently excited by the LEDs 51 and 52 and can efficiently emit red light, bluish green to yellow light, or white light. In one embodiment, the luminescent material 58 is directly disposed on the LEDs 51 and 52. In another embodiment, the luminescent material 58 is remotely disposed around the LEDs 51 and 52. For example, the luminescent material 58 is separated from the LEDs 51 and 52 by an encapsulation material. In yet another embodiment, the luminescent material 58 is disposed directly on and remotely around the LEDs 51 and 52. In the present embodiment, the luminescent material 58 is dispersed in the transparent material 60, such as silicone or epoxy. The transparent material 60 with the dispersed luminescent material 58 is disposed around the LEDs 51 and 52, as illustrated in FIG. 1.

Various advantages may be present in one or more embodiments of the nitridosilicate luminescent material 58 ($Sr_{1-x}Si_6N_8:Ce^{3+}_x$ or $Sr_{1-2x}Si_6N_8:Ce^{3+}_x, Li^+_x$ or $M_{x-z}Si_yN_{2/3x+11/9y}:RE_z$) and the radiation device 50. In one embodiment, the strontium nitridosilicate phosphor $Sr_{1-x}Si_6N_8:Ce^{3+}_x$ or $Sr_{1-2x}Si_6N_8:Ce^{3+}_x, Li^+_x$ emits red light under blue light excitation and emits blue light under UV light excitation. Furthermore, the strontium nitridosilicate phosphor, $Sr_{1-2x}Si_6N_8:Ce^{3+}_x, Li^+_x$ or $Sr_{1-2x}Si_6N_8:Ce^{3+}_x, Li^+_x$, is the first $Ce^{3+}$-doped nitride phosphor that emits red light under blue excitation.

As one example, the nitridosilicate luminescent material 58 includes an excitation spectrum having a wavelength range between about 400 nm and about 500 nm. Accordingly, the nitridosilicate luminescent material 58 emits a broad emission band in the wavelength of about 550 nm to about 800 nm. In this example, the nitridosilicate luminescent material 58 also includes another excitation spectrum having a wavelength range between about 300 nm and about 400 nm. Accordingly, the nitridosilicate luminescent material 58 emits a broad emission band in the wavelength of about 400 nm and about 600 nm.

Particularly, this strontium nitridosilicate phosphor has an excitation spectrum with a peak ranging from about 430 nm to about 490 nm, such as about 460 nm, matching the emission spectrum of a LED having an emission peak at the same range, such as an indium gallium nitride (InGaN) LED that has an emission peak at about 460 nm, which will enhance conversion efficiency from blue light to red light. Additionally, the strontium nitridosilicate phosphor can be excited by both blue light and UV light and emits a broad band of lights accordingly. Therefore, the radiation device 50 incorporates only the strontium nitridosilicate phosphor for both LEDs 51 and 52.

LED lighting usually uses nitridosilicates and oxonitridosilicates to enhance color rendering index (CRI) and chemical stability due to high condensed frameworks. According to crystal field splitting theory, nitrides should get more red shift emitting than oxides. U.S. Pat. No. 6,649,946 discloses yellow to red emitting nitride phosphors doped by europium (Eu), such as $(Ca, Sr, Ba)_x Si_y N_z$:Eu ($z=2/3x+4/3y$), which is synthesized at normal pressure. In contrast, the nitridosilicate luminescent material 58 is synthesized at a high pressure. Most existing red nitride phosphors are doped by Eu. In contrast, the nitridosilicate luminescent material 58 is the first Ce-doped nitride phosphor that emits red light under blue light excitation. And, the nitridosilicate luminescent material 58 further emits blue light under UV light excitation.

Figure 8:
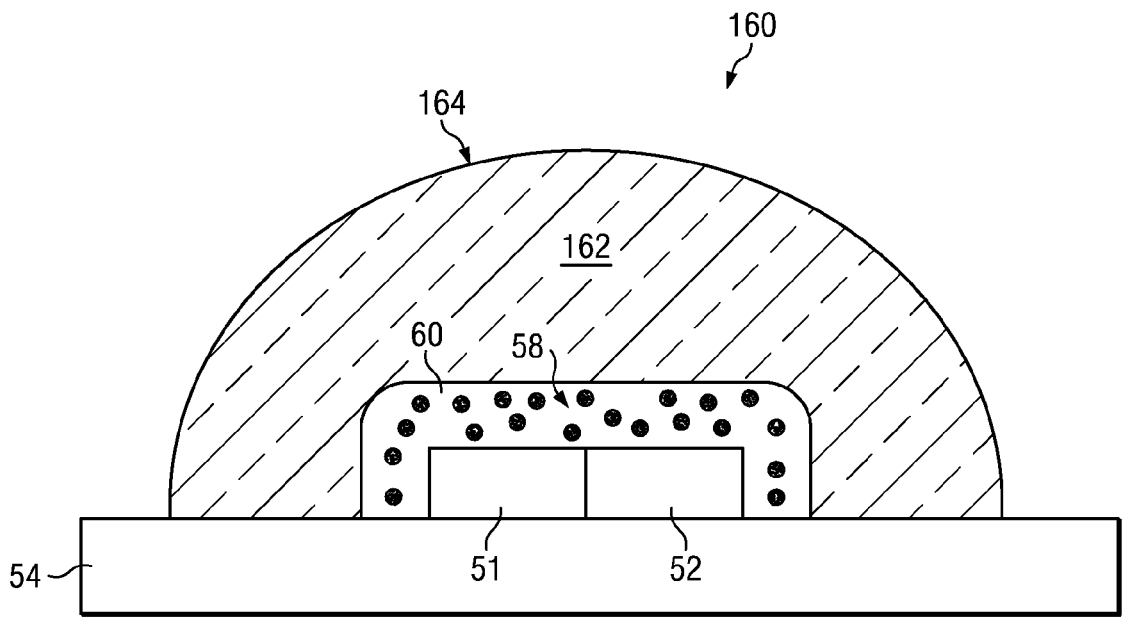
FIG. 8 is a diagrammatic view of another embodiment of a radiation device.

FIG. 8 is a diagrammatic view of a radiation device 160 constructed according to another embodiment of the present disclosure. The radiation device 160 includes LEDs 51 and 52 configured together. The LEDs 51 and 52 are similar to the LEDs 51 and 52 described above with reference to FIG. 1. For example, each of the first and second LEDs (51 and 52) is designed to emit light with a particular emission spectrum. Particularly, the first LED 51 emits light having a first central wavelength. The second LED 52 emits light having a second central wavelength less than the first central wavelength. In the present embodiment, the first LED 51 emits blue light, and thus may be referred to as a blue LED. The second LED 52 emits ultra-violet (UV) light, and thus may be referred to as an UV-LED. In another example, the first LED 51 includes gallium nitride and indium gallium nitride (GaN—InGaN). In another example, the second LED 52 includes aluminum gallium nitride (AlGaN).

The LEDs 51 and 52 are configured side by side. Alternatively, the LEDs 51 and 52 may be configured otherwise for proper light emitting effect in various applications. In one embodiment, the LEDs 51 and 52 may be formed in a same substrate, such as a sapphire, silicon carbide, gallium nitride, or silicon substrate. For example, a gallium nitride layer is formed on a silicon substrate. Then, a patterned indium gallium nitride is formed on the gallium nitride layer and is designed for the first LED 51. A patterned aluminum gallium nitride is then formed on the gallium nitride layer and is designed for the second LED (UV-LED) 52.

The radiation device 160 also includes a support substrate 54, such that the LEDs 51 and 52 can be attached thereon. The support substrate 54 is similar to the support substrate 54 of FIG. 1. For example, the LEDs 51 and 52 are attached to the support substrate 54 through an adhesive material, such as silver paste or soldering. In one embodiment, the support substrate 54 includes a silicon wafer or a portion of the silicon wafer. In furtherance of the embodiment, the electrodes of the LEDs can be routed to a power supply through a proper structure, such as a TSV.

The radiation device 50 includes the luminescent material (or phosphor) 58 positioned around the LEDs 51 and 52 and designed to shift light emitted from the LEDs 51 and 52. The luminescent material 58 is defined and described in detail with FIG. 1. The luminescent material 58 is operable to be excited by the LED 51 and to emit light having a wavelength ranging from about 550 nm to about 800 nm. Additionally, the luminescent material 58 is operable to be excited by the LED 52 and to emit light having a wavelength ranging from about 400 nm to about 600 nm.

The luminescent material 58 is a nitridosilicate phosphor $Ce^{3+}$ doped or $Ce^3$, $Li^+$ co-doped. The nitridosilicate phosphor has a composition with a formula of $M_{x-z}Si_y N_{2/3x+11/9y}$:$RE_z$, where M=Ca, Sr, or Ba; parameters x, y, and z satisfy $0<z<x<y$; and RE is rare earth element(s) $Ce^{3+}$, or $Ce^{3+}$ and $Li^+$. In one embodiment, the nitridosilicate phosphor includes cerium doped ($Ce^{3+}$) strontium nitridosilicate, $Sr_{1-x}Si_6N_8$:$Ce^{3+}_x$. In one example, the parameter x ranges between about 0.05 to about 0.5, formulated as $0.5 > X \geq 0.05$. In another embodiment, the nitridosilicate phosphor includes cerium and lithium-codoped ($Ce^{3+}$, $Li^+$) strontium nitridosilicate, $Sr_{1-2x}Si_6N_8$:$Ce^{3+}_x$, $Li^+_x$. In one example, the parameter x ranges between about 0.05 to about 0.5, formulated as $0.5 > X \geq 0.05$.

The luminescent material 58 is distributed around the LEDs 51 and 52. For example, the luminescent material 58 is dispersed in material 60, such as silicone or epoxy. The material 60 with the dispersed luminescent material 58 is disposed around the LEDs 51 and 52.

The radiation device 160 further includes a lens 162 formed on and aligned with the LEDs 51 and 52 for emission efficiency of the radiation device 160. In one embodiment, the lens 162 includes a curved surface 164 in a way to effectively focus the emitted light of the radiation device 160. The lens 162 includes a transparent material formed on the support substrate and further encapsulates the LEDs 51 and 52 and the luminescent material 58 as illustrated in FIG. 8. In one embodiment, the transparent material includes transparent silicone formed by a proper technology, such as molding. The radiation device 160 may includes other components, such as other packaging components or driving circuits.

Thus, the present disclosure provides a radiation device including a first light emitting diode (LED) operable to emit light having a first central wavelength; a second LED configured adjacent the first LED and operable to emit light having a second central wavelength substantially less than the first central wavelength; and a luminescent material disposed on the first LED and the second LED. The luminescent material includes a strontium silicon nitride ($SrSi_6N_8$) doped by cerium ($Ce^{3+}$) or cerium, lithium ($Ce^{3+}$, $Li^+$).

In one embodiment, the first LED includes an emission spectrum having a wavelength range from 400 nm to 500 nm. In another embodiment, the first LED includes indium gallium nitride (InGaN). In yet another embodiment, the second LED includes an emission spectrum having a wavelength range from 360 nm to 430 nm. In yet another embodiment, the second LED includes aluminum gallium nitride (AlGaN). The first and second LEDs may be attached to a support substrate by one of silver pate and soldering.

Each of the first and second LEDs may include a semiconductor substrate selected from the group consisting of sapphire, silicon carbide, gallium nitride and silicon. In one embodiment, the luminescent material is powdered and dispersed in a material selected from the group consisting of silicone and epoxy. The radiation device may further include a reflective surface configured adjacent the first and second LEDs for emission efficiency. The radiation device may further include a lens configured on and aligned with the first and second LEDs.

In various embodiment, the strontium silicon nitride is formulated as $Sr_{1-x}Si_6N_8$:$Ce^{3+}_x$ or $Sr_{1-2x}Si_6N_8$:$Ce^{3+}_x$, $Li^{3+}_x$, wherein x ranges between about 0.05 and about 0.5. In another embodiment, the luminescent material emits red light excited by the first LED and emits blue light. bluish green light to yellow light excited by the second LED. In another embodiment, the luminescent material includes an emission spectrum having a wavelength range from 550 nm to 800 nm when excited by the first LED; and an emission spectrum having a wavelength range from 400 nm to 600 nm when excited by the second LED.

The present disclosure also provides another embodiment of a radiation device. The radiation device includes a first light emitting diode (LED) operable to emit blue light; a second LED configured adjacent the first LED and operable to emit ultraviolet (UV) light; and a rare earth element doped nitridosilicate phosphor formulated as $M_{x-z}Si_y N_{2/3x+11/9y}$:

$RE_z$. M is one of calcium (Ca), strontium (Sr), and barium (Ba); x, y, and z are satisfy $0<z<x<y$; and RE is cerium ($Ce^{3+}$) or cerium and lithium ($Ce^{3+}$ and $Li^+$). The rare earth element doped nitridosilicate phosphor is disposed on the first and second LEDs.

In one embodiment, the rare earth element doped nitridosilicate phosphor includes a strontium silicon nitride ($SrSi_6N_8$) doped by one of a first dopant having cerium ($Ce^{3+}$), formulated as $Sr_{1-x}Si_6N_8:Ce^{3+}_x$ and a second dopant having cerium and lithium ($Ce_{3+}$, $Li_+$), formulated as $Sr_{1-2x}Si_6N_8:Ce^{3+}_x, Li^{3+}_x$, wherein x ranges between about 0.05 and about 0.5. In other embodiments, the first LED includes indium gallium nitride (InGaN); the second LED includes aluminum gallium nitride (AlGaN); and the rare earth element doped nitridosilicate phosphor is dispersed in one of silicone and epoxy.

The present disclosure also provides a method. The method includes attaching a first light-emitting diode (LED) having indium gallium nitride (InGaN) to a support substrate; attaching a second LED having aluminum gallium nitride (AlGaN) to the support substrate; and disposing a luminescent material on the first LED and second LED, wherein the luminescent material includes a strontium silicon nitride ($SrSi_6N_8$) doped by cerium ($Ce^{3+}$) or cerium, lithium ($Ce^{3+}$, $Li^+$).

In one embodiment, the disposing the luminescent material includes dispersing the luminescent material into a material selected from one of silicone and epoxy; and disposing the material with the luminescent material on the first and second LEDs. The method further includes forming the luminescent material by mixing stoichiometrically powdered strontium nitride ($Sr_3N_2$), silicon nitride ($Si_3N_4$), and cerium oxide ($CeO_2$), thereby forming a mixture; and sintering the mixture under a high pressure and a high temperature, thereby forming a luminescent material having a strontium silicon nitride ($SrSi_6N_8$) doped by cerium ($Ce^{3+}$). The method may further includes forming one of a reflective feature approximate the first and second LEDs; and a lens configured on and aligned with the first and second LEDs. In one embodiment, the high pressure is equal to or greater than about 0.9 MPa under a nitrogen atmosphere. In another embodiment, the high temperature ranges between about 1800° C. and about 2000° C.; and the sintering includes a sintering duration greater than about 0.5 hour. In yet another embodiment, the mixing stoichiometrically powdered strontium nitride ($Sr_3N_2$), silicon nitride ($Si_3N_4$), and cerium oxide ($CeO_2$) includes additionally mixing lithium nitride ($Li_3N$) into the mixture, forming the strontium silicon nitride ($SrSi_6N_8$) doped by cerium ($Ce^{3+}$) and lithium ($Li^+$).

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
    attaching a first light-emitting diode (LED) having indium gallium nitride (InGaN) to a support substrate;
    attaching a second LED having aluminum gallium nitride (AlGaN) to the support substrate; and
    disposing a luminescent material on the first LED and the second LED, wherein the luminescent material includes a strontium silicon nitride ($SrSi_6N_8$) doped by one of cerium ($Ce^{3+}$) and cerium, lithium ($Ce^{3+}$, $Li^+$) in a manner so that the doped stronium silicon nitride is formulated as one of: $Sr_{1-x}Si_6N_8:Ce^{3+}_x$ and $Sr_{1-2x}Si_6N_8:Ce^{3+}_x, Li^+_x$, wherein x ranges between about 0.05 and about 0.5.

2. The method of claim 1, wherein the disposing the luminescent material includes:
    dispersing the luminescent material into a material selected from one of silicone and epoxy; and
    disposing the material with the luminescent material on the first and second LEDs.

3. The method of claim 1, further comprising forming the luminescent material by:
    mixing stoichiometrically powdered strontium nitride ($Sr_3N_2$), silicon nitride ($Si_3N_4$), and cerium oxide ($CeO_2$), thereby forming a mixture; and
    sintering the mixture under a high pressure and a high temperature, thereby forming a luminescent material having a strontium silicon nitride ($SrSi_6N_8$) doped by cerium ($Ce^{3+}$).

4. The method of claim 1, further comprising forming one of:
    a reflective feature approximate the first and second LEDs; and
    a lens configured on and aligned with the first and second LEDs.

5. A radiation device comprising:
    a first light emitting diode (LED) operable to emit light having a first central wavelength;
    a second LED configured adjacent the first LED and operable to emit light having a second central wavelength substantially less than the first central wavelength; and
    a luminescent material disposed on the first LED and the second LED, wherein the luminescent material includes a strontium silicon nitride ($SrSi_6N_8$) doped by one of: cerium ($Ce^{3+}$) and cerium, lithium ($Ce^{3+}$, $Li^+$) in a manner so that the doped stronium silicon nitride is formulated as one of: $Sr_{1-x}Si_6N_8:Ce^{3+}_x$ and $Sr_{1-2x}Si_6N_8:Ce^{3+}_x, Li^+_x$, wherein x ranges between about 0.05 and about 0.5.

6. The radiation device of claim 1, wherein the first LED includes an emission spectrum having a wavelength range from 400 nm to 500 nm.

7. The radiation device of claim 1, wherein the first LED includes indium gallium nitride (InGaN).

8. The radiation device of claim 1, wherein the second LED includes an emission spectrum having a wavelength range from 360 nm to 430 nm.

9. The radiation device of claim 1, wherein the second LED includes aluminum gallium nitride (AlGaN).

10. The radiation device of claim 1, wherein the first and second LEDs are attached to a support substrate by one of silver paste and soldering.

11. The radiation device of claim 1, wherein each of the first and second LEDs includes a semiconductor substrate selected from the group consisting of sapphire, silicon carbide, gallium nitride, and silicon.

12. The radiation device of claim 1, wherein the luminescent material is powdered and dispersed in a material selected from the group consisting of silicone and epoxy.

13. The radiation device of claim 1, further including a reflective surface configured adjacent the first and second LEDs for emission efficiency.

14. The radiation device of claim 1, further including a lens configured on and aligned with the first and second LEDs.

15. The radiation device of claim 1, wherein the luminescent material emits red light excited by the first LED and emits bluish green light to yellow light excited by the second LED.

16. The radiation device of claim 1, wherein the luminescent material includes:
- an emission spectrum having a wavelength range from 550 nm to 800 nm when excited by the first LED; and
- an emission spectrum having a wavelength range from 400 nm to 600 nm when excited by the second LED.

17. A radiation device comprising:
- a first light emitting diode (LED) operable to emit blue light;
- a second LED configured adjacent the first LED and operable to emit ultraviolet (UV) light;
- a rare earth (RE) element doped nitridosilicate phosphor formulated as $M_{x-z}Si_yN_{2/3x+11/9y}:RE_z$; where
  - M is one of calcium (Ca), strontium (Sr), and barium (Ba);
  - x, y, and z satisfy $0<z<x<y$; and
  - RE is one of cerium ($Ce^{3+}$) and cerium, lithium ($Ce^{3+}$, $Li^+$), wherein when M is strontium, the rare earth element doped nitridosilicate phosphor is formulated as one of: $Sr_{1-x}, Si_6N_8:Ce^{3+}_x$ and $Sr_{1-2x}Si_6N_8:Ce^{3+}_x, Li^+_x$, wherein x ranging between about 0.05 and about 0.5, and wherein the rare earth element doped nitridosilicate phosphor is disposed on the first and second LEDs; and
- a lens covering the first and second LEDs and the rare earth element doped nitrodosilicate phosphor.

18. The radiation device of claim 17, wherein the rare earth element doped nitridosilicate phosphor includes:
- a strontium silicon nitride ($SrSi_6N_8$) doped by one of a first dopant having cerium ($Ce^{3+}$), formulated as $Sr_{1-x}Si_6N_8:Ce^{3+}_x$ and a second dopant having cerium and lithium ($Ce_{3+}$, $Li_+$), formulated as $Sr_{1-2x}Si_6N_8:Ce^{3+}_x, Li^{3+}_x$, wherein x ranges between about 0.05 and about 0.5.

19. The radiation device of claim 17, wherein:
- the first LED includes indium gallium nitride (InGaN);
- the second LED includes aluminum gallium nitride (AlGaN); and
- the rare earth element doped nitridosilicate phosphor is dispersed in one of silicone and epoxy.

* * * * *